US012772767B2

(12) United States Patent
Peng

(10) Patent No.: US 12,772,767 B2
(45) Date of Patent: Oct. 20, 2026

(54) METHOD OF MANUFACTURING SEMICONDUCTOR STRUCTURE

(71) Applicant: NANYA TECHNOLOGY CORPORATION, New Taipei city (TW)

(72) Inventor: Jung Tzu Peng, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 302 days.

(21) Appl. No.: 18/626,373

(22) Filed: Apr. 4, 2024

(65) Prior Publication Data

US 2025/0316492 A1 Oct. 9, 2025

(51) Int. Cl.

| | |
|---|---|
| ***H10P 50/28*** | (2026.01) |
| ***H10P 50/00*** | (2026.01) |
| ***H10P 76/20*** | (2026.01) |
| *G03F 7/004* | (2006.01) |
| *G03F 7/075* | (2006.01) |
| *H10P 14/60* | (2026.01) |
| *H10P 52/40* | (2026.01) |
| *H10P 95/00* | (2026.01) |

(52) U.S. Cl.

CPC .......... *H10P 50/287* (2026.01); *H10P 50/696* (2026.01); *H10P 76/2041* (2026.01); *G03F 7/0041* (2013.01); *G03F 7/0752* (2013.01); *H10P 14/6339* (2026.01); *H10P 52/407* (2026.01); *H10P 95/04* (2026.01); *H10P 95/062* (2026.01)

(58) Field of Classification Search

CPC .. H10P 50/287; H10P 50/696; H10P 76/2041; H10P 14/6339; H10P 52/407; H10P 95/04; H10P 95/062; G03F 7/0041; G03F 7/0752

See application file for complete search history.

(56) References Cited

U.S. PATENT DOCUMENTS

| | | | | |
|---|---|---|---|---|
| 10,916,427 B2 * | 2/2021 | Chang | H10P 50/73 | |
| 11,887,851 B2 * | 1/2024 | Chang | H10P 76/204 | |
| 2012/0252218 A1 * | 10/2012 | Kori | G03F 7/094 | 257/E21.255 |
| 2019/0148221 A1 * | 5/2019 | Peng | H10P 76/4085 | 257/758 |
| 2020/0216670 A1 * | 7/2020 | Yano | C08G 77/80 | |
| 2023/0102166 A1 * | 3/2023 | Hsieh | H10P 14/6342 | 438/780 |

* cited by examiner

*Primary Examiner* — Anita K Alanko

(74) *Attorney, Agent, or Firm* — CKC & Partners Co., LLC

(57) ABSTRACT

Embodiments of this disclosure provide a method of manufacturing a semiconductor structure, including the following steps. A substrate with an active device layer on the substrate is provided. A stack film layer on the active device layer is formed. A resist platform layer on the stack film layer is formed. A blocking layer is deposited on the resist platform layer conformally. A photoresist layer is formed on the blocking layer, and a top surface of the photoresist layer is higher than a topmost surface of the blocking layer. The resist platform layer is etched until exposing top surfaces of the blocking layer to form first openings. The blocking layer, the resist platform layer and the stack film layer are etched based on first openings until exposing top surfaces of the active device layer to form second openings.

19 Claims, 8 Drawing Sheets

METHOD OF MANUFACTURING SEMICONDUCTOR STRUCTURE

BACKGROUND

Field of Invention

The present disclosure relates to a semiconductor structure and a method of manufacturing the same. More particularly, the present disclosure relates a semiconductor structure and a method of manufacturing the same through using a resist platform layer and a photoresist layer on the platform layer.

Description of Related Art

As electronic devices become lighter and thinner, semiconductor devices, such as dynamic random access memory (DRAM) become more highly integrated. Further, the performance of the DRAM is improved via shortening the pitch between the semiconductor structures in the DRAM. Due to shrinking the size of the semiconductor structure, in addition to increasing the difficulty of the manufacturing process, the components in the semiconductor structures are also prone to leakage resulting from too close distances.

As a result, in the semiconductor manufacturing process, how to reduce the leakage to improve the process yield of the semiconductor structure has become an important issue.

SUMMARY

Embodiments of this disclosure provide a method of manufacturing a semiconductor structure, including the following steps. A substrate with an active device layer on the substrate is provided. A stack film layer on the active device layer is formed. A resist platform layer on the stack film layer is formed. A blocking layer is deposited on the resist platform layer conformally. A photoresist layer is formed on the blocking layer, and a top surface of the photoresist layer is higher than a topmost surface of the blocking layer. The resist platform layer is etched until exposing a plurality of top surfaces of the blocking layer to form a plurality of first openings. The blocking layer, the resist platform layer and the stack film layer are etched based on the plurality of first openings until exposing a plurality of top surfaces of the active device layer to form a plurality of second openings.

In some embodiments, etching the plurality of first openings includes the following steps. A reticle layer containing a hole pattern is formed on the photoresist layer by a lithography process, and the reticle layer exposes a plurality of exposed top surfaces of the photoresist layer. The photoresist layer at positions of the plurality of exposed top surfaces of the photoresist layer is etched until exposing the plurality of top surfaces of the blocking layer. The reticle layer is removed.

In some embodiments, the hole pattern is corresponding to an area of the plurality of first openings.

In some embodiments, the hole pattern is determined by a boundary rule.

In some embodiments, the boundary rule is that a shortest distance from an edge of each of the plurality of first openings to a closest edge of the resist platform layer is from 0.1 micrometers to 5 micrometers in a top view.

In some embodiments, after etching the blocking layer, the resist platform layer and the stack film layer to form the plurality of second openings, a conductive material is filled in the plurality of second openings to form a plurality of interconnect structures in the stack film layer.

In some embodiments, the resist platform layer is a KrF photoresist layer.

In some embodiments, the photoresist layer is an ArF photoresist layer.

In some embodiments, since an etching selectivity of the photoresist layer is greater than an etching selectivity of the blocking layer, the plurality of first openings are etched until exposing the plurality of top surfaces of the blocking layer.

In some embodiments, since an etching selectivity of the blocking layer is greater than an etching selectivity of the resist platform layer and the etching selectivity of the resist platform layer is greater than an etching selectivity of the stack film layer, the plurality of second openings are formed after etching through the blocking layer.

Embodiments of this disclosure provide a method of manufacturing a semiconductor structure, including the following steps. A substrate with an active device layer on the substrate is provided. A stack film layer is formed on the active device layer. A resist platform layer is formed on the stack film layer based on a hole pattern. A blocking layer is deposited on the resist platform layer conformally. A photoresist layer is formed on the blocking layer, and a top surface of the photoresist layer is higher than a topmost surface of the blocking layer. The photoresist layer is etched until exposing a plurality of exposed top surfaces of the blocking layer based on the hole pattern to form a plurality of first openings, and the hole pattern is corresponding to an area of the plurality of first openings. The blocking layer, the resist platform layer and the stack film layer are etched until exposing a plurality of top surfaces of the active device layer based on the plurality of first openings to form a plurality of second openings.

In some embodiments, a shortest distance from an edge of each of the plurality of first openings to a closest edge of the resist platform layer is 0.1 micrometers to 5 micrometers in a top view.

In some embodiments, the hole pattern comprises an single-hole pattern, a multiple-hole pattern or a combination thereof.

In some embodiments, a thickness of the resist platform layer is from 100 nanometers to 200 nanometers.

In some embodiments, a second thickness measured from a top surface of the photoresist layer to a top surface of the blocking layer on the stack film layer is greater than a first thickness measured from the top surface of the photoresist layer to the top surface of the blocking layer on the resist platform layer.

In some embodiments, after etching the photoresist layer to form the plurality of first openings, the photoresist layer is served as a negative photoresist layer when etching the blocking layer, the resist platform layer and the stack film layer to form the plurality of second openings.

In some embodiments, a first etching selectivity of the photoresist layer is greater than a second etching selectivity of the blocking layer.

In some embodiments, the second etching selectivity of the blocking layer is greater than a third etching selectivity of the resist platform layer, and the third etching selectivity of the resist platform layer is greater than a fourth selectivity of the stack film layer.

In some embodiments, the method further includes the following steps. A conductive material is filled in each of the plurality of second openings. The excessive conductive material out of each of the plurality of second openings is planarized to form a conductive layer. Also, after planarizing the excessive conductive material out of each of the plurality of second openings, a top surface of the conductive layer and each of the plurality of top surfaces of the stack film layer are coplanar.

In some embodiments, a bottom surface of the conductive layer contacts each of the plurality of top surfaces of the active device layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The disclosure can be more fully understood by reading the following detailed description of the embodiment, with reference made to the accompanying drawings as follows.

DETAILED DESCRIPTION

Figure 1:
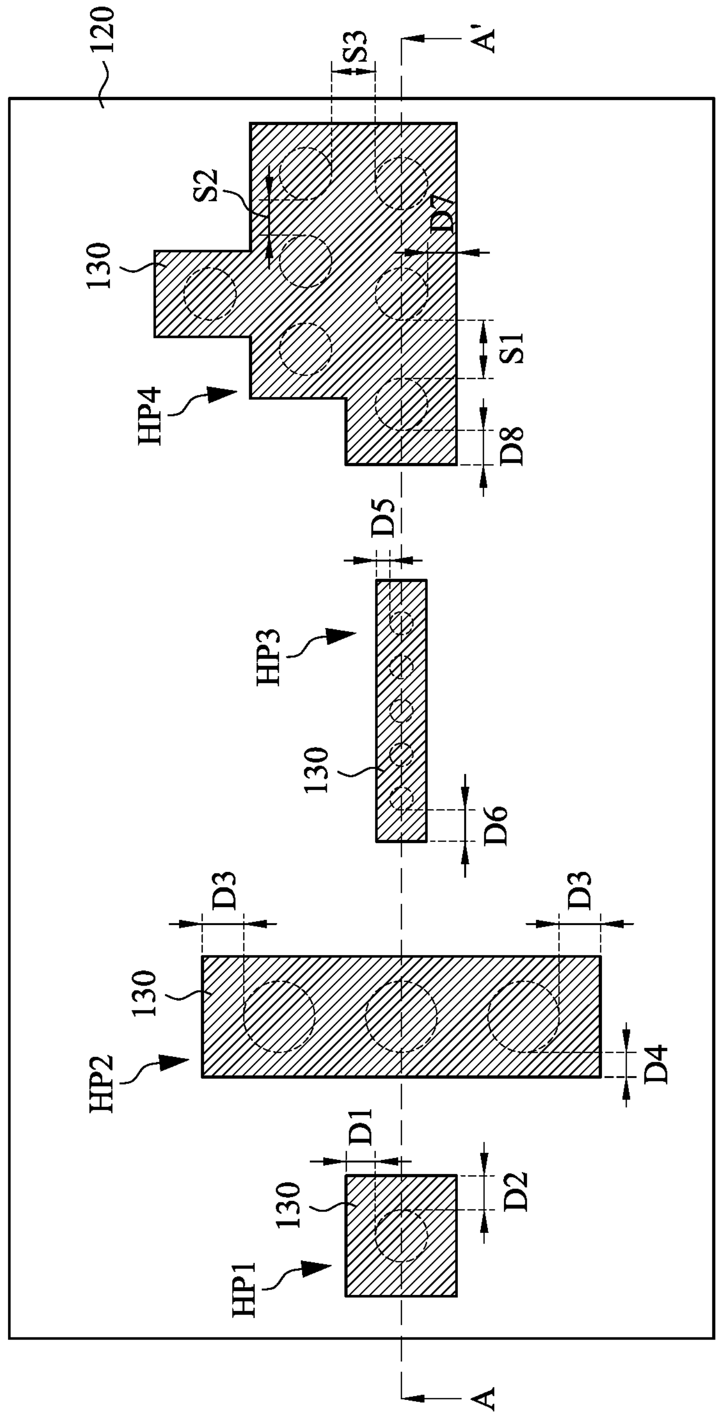
FIG. 1 is a top view of a method of manufacturing a semiconductor structure in forming a resist platform layer according to some embodiments of this disclosure.
Figure 1:
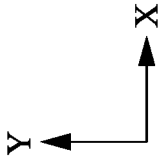

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

As a critical dimension (CD) of semiconductor structures becomes smaller and smaller, holes formed in the semiconductor structures through a lithography process also become smaller. However, a thickness of a photoresist layer no longer meets a CD resolution of the holes and provides a sufficient etching resistance for forming the holes. Therefore, embodiments of this disclosure provide a method of manufacturing a semiconductor structure through using a resist platform layer and a photoresist layer on the platform layer.

It should be noted that when the following figures, such as FIGS. 1 to 8, are illustrated and described as a series of operations or steps, the description order of these operations or steps should not be limited. For example, some operations or steps may be undertaken in a different order than in the present disclosure, or some operations or steps may occur currently, or some operations may not be used, and/or some operations or steps may be repeated. Moreover, the actual operations or steps of process stages may require additional operations or steps before, during or after forming the semiconductor structure (for example, a semiconductor structure 100 in FIG. 8) to completely form the semiconductor structure 100. Therefore, the present disclosure may briefly illustrate some of these additional operations or steps. Further, unless otherwise stated, the same explanations discussed for the following figures, such as FIGS. 1 to 8, apply directly to the other figures.

Figure 2:
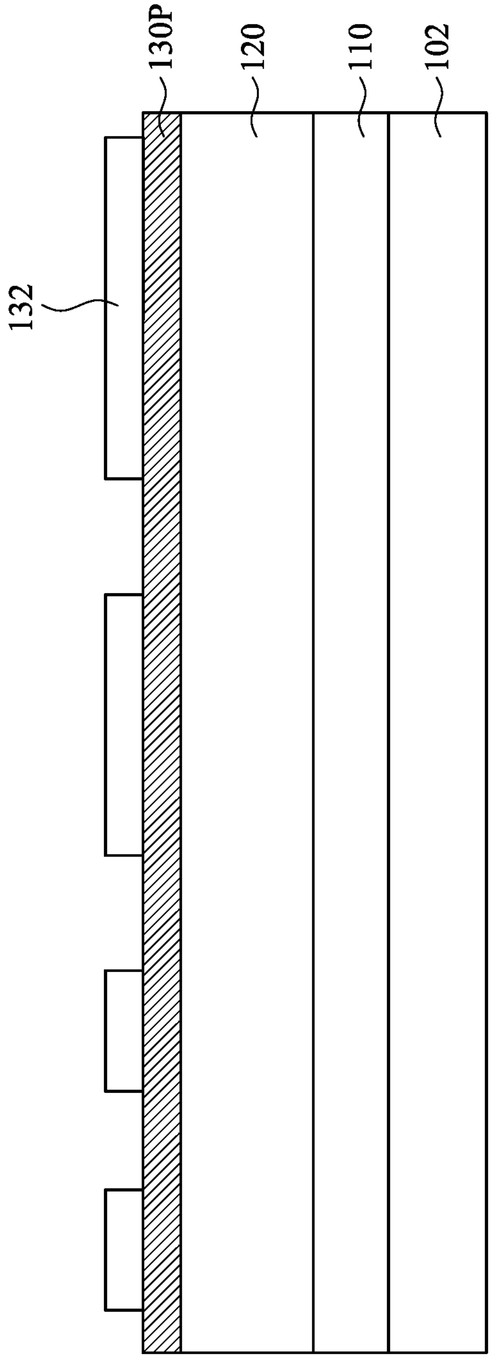
FIGS. 2-3 is cross-section views of a method of manufacturing a semiconductor structure in forming a resist platform layer based on a cross-section AA' of FIG. 1 according to some embodiments of this disclosure.
Figure 3:
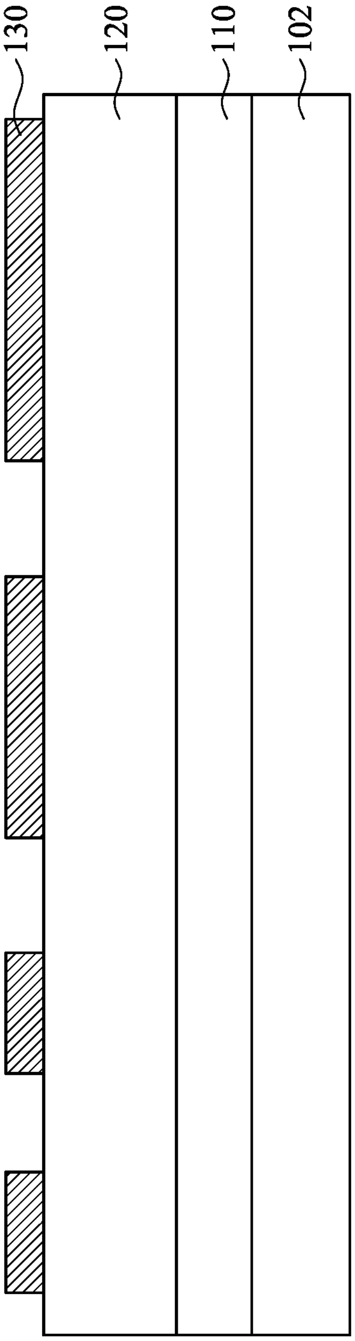

Please refer to FIGS. 1 to 3. FIG. 1 is a top view of a method of manufacturing a semiconductor structure in forming a resist platform layer according to some embodiments of this disclosure, and FIGS. 2 to 3 is cross-section views of a method of manufacturing a semiconductor structure in forming a resist platform layer based on a cross-section AA' of FIG. 1 according to some embodiments of this disclosure.

As shown in FIG. 2, a substrate 102 is provided, and an active device layer disposed on the substrate is provided. In some embodiments, the substrate 102 may include silicon, such as crystalline silicon, polycrystalline silicon, or amorphous silicon. The substrate 102 may include an elemental semiconductor, such as germanium. In some embodiments, the substrate 102 may include alloy semiconductors, such as silicon germanium, silicon germanium carbide, gallium indium phosphide, or other suitable materials. In some embodiments, the substrate 102 may include compound semiconductors, such as silicon carbide (SiC), gallium arsenide (GaAs), indium phosphide (InP), indium arsenide (InAs), or other suitable materials. Moreover, in some embodiments, the substrate 102 can optionally have a semiconductor-on-insulator (SOI) structure. Moreover, the active device layer 110 includes gate structures, word line structures, bit line structures, contact plugs and other active features.

Next, a stack film layer 120 is formed on the active device layer 110. Further, in order to improve the resolution of a hole pattern on a photoresist layer 150 described later, a resist platform layer 130 (such as in FIG. 3) is formed on the stack film layer 120. Specifically, as shown in FIG. 2, a resist layer 130P is formed on the stack film layer 120. Then, a mask layer 132 is formed on the resist layer 130P based on the hole pattern and a boundary rule to expose a plurality of top surfaces of the resist layer 130P. The hole pattern and the boundary rule is described in detail later. Then, as shown in FIG. 3, a lithography process is performed on the exposed top surfaces, and a plurality of portions of the resist layer 130P (such as in FIG. 2) are removed to formed a resist platform layer 130 on the stack film layer 120. The mask layer 132 (such as in FIG. 2) is removed after forming the resist platform layer 130. In some embodiments, the resist platform layer 130 is a KrF resist layer. In some embodiments, a thickness of the resist platform layer 130 is from 100 nm to 200 nm. In addition, a hole pattern is designed based on interconnect structures for electrically connecting the active device layer 110 and upper conductive features. Also, since the upper conductive features requires multiple subsequent operations to obtain and the embodiments of this disclosure are not focus on the upper conductive features, the upper conductive features are not shown in the figures.

Furthermore, the thickness of the resist platform layer 130 may be related to a dimension of each of the openings (such as first openings OP1 in FIG. 6 and second openings OP2 in FIG. 7 described later, and also referred as to the holes).

Referring to a general operation of designing the openings (such as first openings OP1 in FIG. 6 and second openings OP2 in FIG. 7 described later) in the semiconductor structure (such as a semiconductor structure 100 in FIG. 8), the openings disposed adjacent to each other cannot typically and exactly be predicted. Therefore, the resist platform layer 130 is formed on the stack film layer 120 based on a hole pattern. As shown the top view of in FIG. 1, in some embodiments, based on the hole pattern, a shortest distance from an edge of each of openings (shown with dashed line) of the hole pattern to an edge of the resist platform layer 130 is from 0.1 micrometers (μm) to 5 μm. The shortest distance from the edge of each of the openings of the hole pattern to the edge of the resist platform layer 130 may be referred to herein as a boundary rule. As shown in FIG. 1, the hole pattern includes a single-hole pattern, a multiple-hole pattern or a combination thereof. Also, the number of the different hole patterns HP may be different.

Further, according to exemplary embodiments of this disclosure, the first hole pattern HP1 is the single-hole pattern. A first boundary distance D1 is referred to a short distance from an edge of the first hole pattern HP1 to a closest edge of the resist platform layer 130 in a Y direction, and the first boundary distance D1 is from 0.1 μm to 5 μm. A second boundary distance D2 is referred to a short distance from another edge of the first hole pattern HP1 to another closest edge of the resist platform layer 130 a X direction, and the second boundary distance D2 is from 0.1 μm to 5 μm. In addition, in some embodiments, as long as a relative position relationship between the hole pattern (such as the first hole pattern HP1) and the resist platform layer 130 is complied with the boundary rule, a shape of the resist platform layer 130 may be various shapes, such as rectangular or shaped along an edge of the hole pattern (such as the first hole pattern HP1).

According to exemplary embodiments of this disclosure, the second hole pattern HP2 is the multi-hole pattern. The second hole pattern HP2 includes three openings in FIG. 1, but a number of the second hole pattern HP2 may be any number and are not intended to limit. A third boundary distance D3 is referred to a shortest distance from an edge of the second hole pattern HP2 (e.g. an edge of an openings closest to an edge of the resist platform layer 130) to the closest edge of the resist platform layer 130 in the Y direction, and the third boundary distance D3 is from 0.1 μm to 5 μm. A fourth boundary distance D4 is referred to a shortest distance from another edge of the second hole pattern HP2 to another closest edge of the resist platform layer 130 in the X direction, and the fourth boundary distance D4 is from 0.1 μm to 5 μm. In some embodiments, as long as a relative position relationship between the hole pattern (such as the second hole pattern HP2) and the resist platform layer 130 is complied with the boundary rule, a shape of the resist platform layer 130 may be various shapes, such as rectangular or shaped along an edge of the hole pattern (such as the second hole pattern HP2).

According to exemplary embodiments of this disclosure, the third hole pattern HP3 is the multi-hole pattern. Also, the third hole pattern HP3 is a dense-hole pattern, which referred to openings in the third hole pattern HP3 are quite close to each other. The third hole pattern HP3 includes five openings in FIG. 1, but a number of the third hole pattern HP3 may be any number and are not intended to limit. A fifth boundary distance D5 is referred to a shortest distance from an edge of the third hole pattern HP3 to an edge of the resist platform layer 130 to a closest edge of the resist platform layer 130 in the Y direction, and the fifth boundary D5 distance is from 0.1 μm to 5 μm. A sixth boundary distance D6 is referred to a shortest distance from another edge of the third hole pattern HP3 (e.g. an edge of an opening of the third hole pattern HP3 closest to another edge of the resist platform layer 130) to the another closest edge of the resist platform layer 130 in the X direction, and the sixth boundary D6 distance is from 0.1 μm to 5 μm. In some embodiments, as long as a relative position relationship between the hole pattern (such as the third hole pattern HP3) and the resist platform layer 130 is complied with the boundary rule, a shape of the resist platform layer 130 may be various shapes, such as rectangular or shaped along an edge of the hole pattern (such as the third hole pattern HP3).

According to exemplary embodiments of this disclosure, a fourth hole pattern HP4 is the multi-hole pattern. In this exemplary embodiment, the fourth hole pattern HP4 may include an upper pattern, a middle pattern adjacent to the upper pattern and a lower pattern adjacent to the middle pattern. That is, the upper pattern is the single-hole pattern including one opening, and the middle pattern and the lower pattern are both the multi-hole pattern including three openings. However, a number of the fourth hole pattern HP4 may be any number and are not intended to limit. Moreover, boundary distances of the upper pattern are complied with the boundary rule. Boundary distances of the middle pattern and the lower pattern are complied with the boundary rule. In this exemplary embodiment of the lower pattern, a seventh boundary distance D7 is referred to a shortest distance from an edge of the lower pattern to a closest edge of the resist platform layer 130 in the Y direction, and the seventh boundary distance D7 is from 0.1 μm to 5 μm. In this exemplary embodiment of the lower pattern, an eighth boundary distance D8 is referred to an edge of the fourth hole pattern HP4 (e.g. an edge of an opening of the lower pattern closest to an edge of the resist platform layer 130) to the closest edge of the resist platform layer 130 in the X direction, and the eighth boundary distance D8 is from 0.1 μm to 5 μm. As long as a relative position relationship between the hole pattern (such as the fourth hole pattern HP4) and the resist platform layer 130 is complied with the boundary rule, a shape of the resist platform layer 130 may be various shapes, such as rectangular or shaped along an edge of the hole pattern (such as the fourth hole pattern HP4). Further, since the shape of the resist platform layer 130 is irregular with a configuration of the number of the openings among the upper pattern, the middle pattern and the lower pattern, spaces between the openings in the upper pattern, the middle pattern and the lower pattern are different. In the X direction, a space between the openings of the lower pattern is a first space S1, and a space between the openings of the middle pattern is a second space S2. In this exemplary embodiment, since the numbers of the lower pattern and the middle pattern are the same and a size of the lower pattern is greater than a size of the middle pattern, the first space S1 is greater than the second space S2. A space between the openings of the lower pattern and the middle pattern is a third space S3. The first space S1, the second space S2 and the third space S3 are complied with the boundary rule, so that the openings of the fourth hole pattern HP4 may be ensured completely positioned inside the boundary of the resist platform layer 130.

Furthermore, the maximum outer diameter of each of the openings in the different hole patterns may be different. In this exemplary embodiment of FIG. 1, each of the openings of the third hole pattern HP3 is significantly smaller than each of the openings of the second hole pattern HP2. Also, the maximum outer diameter of each of the openings is from 30 nanometers (nm) to 150 nm. The maximum outer diameter of each of the openings is described in detail later.

Figure 4:
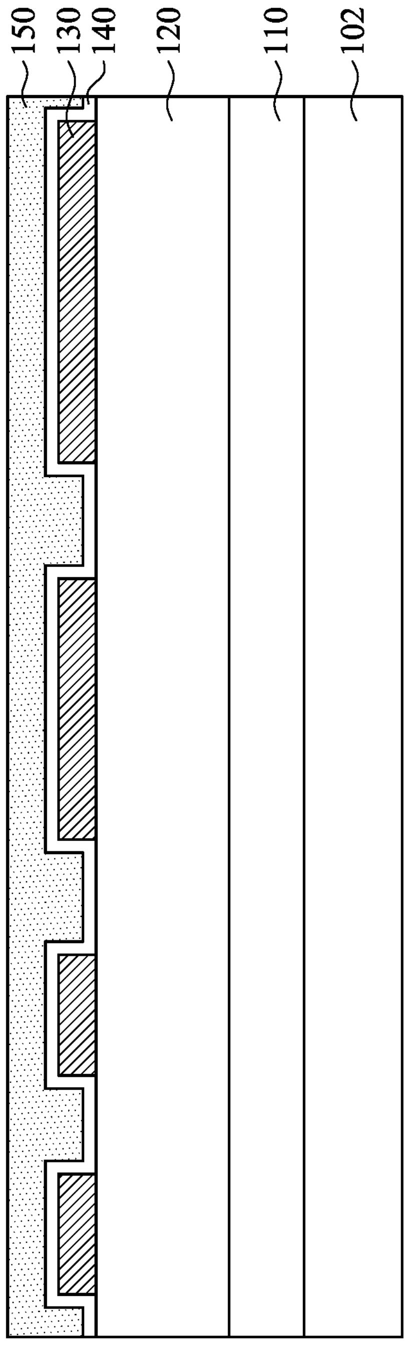
FIGS. 4-6 are cross-section views of a method of manufacturing a semiconductor structure in forming a plurality of first openings based on a cross-section AA' of FIG. 1 according to some embodiments of this disclosure.
Figure 5:
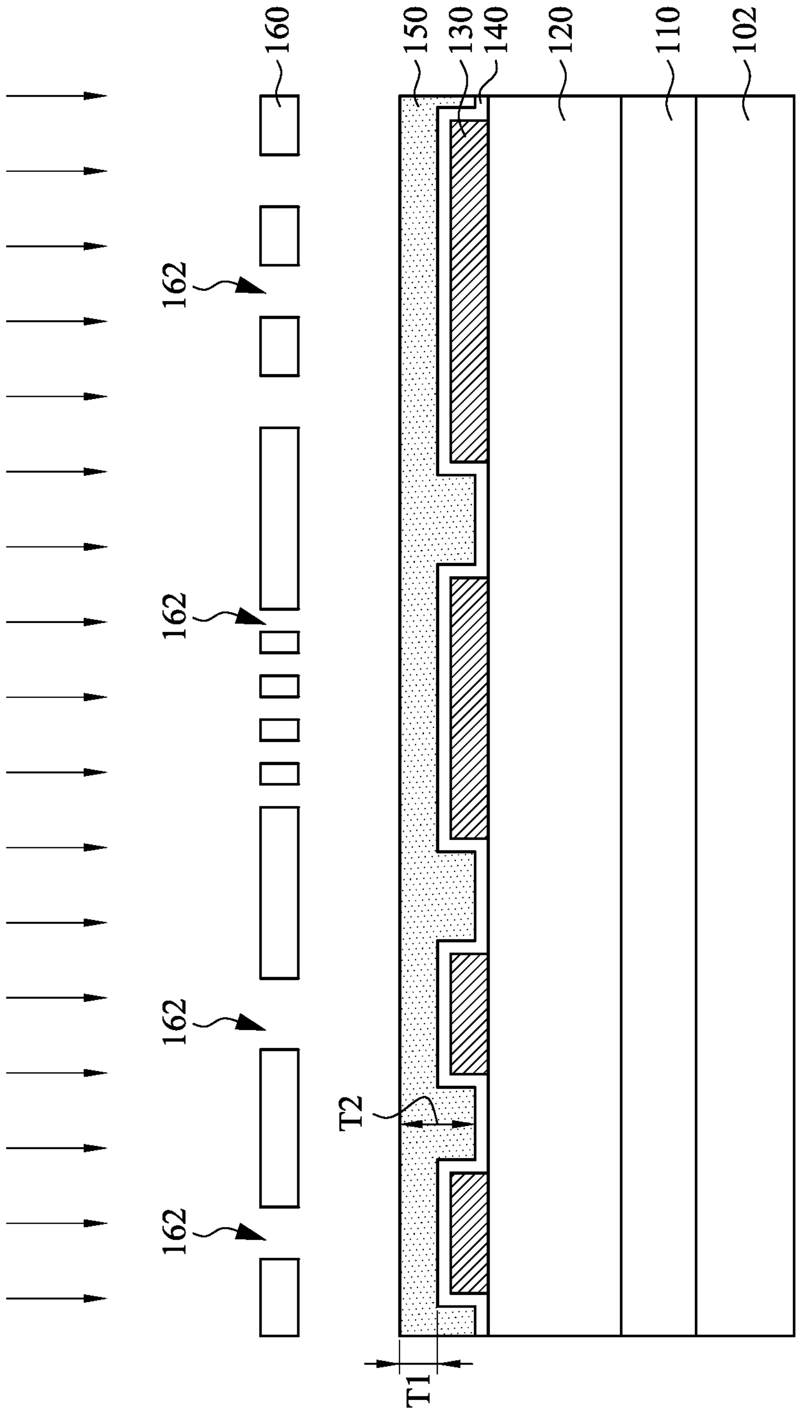
Figure 6:
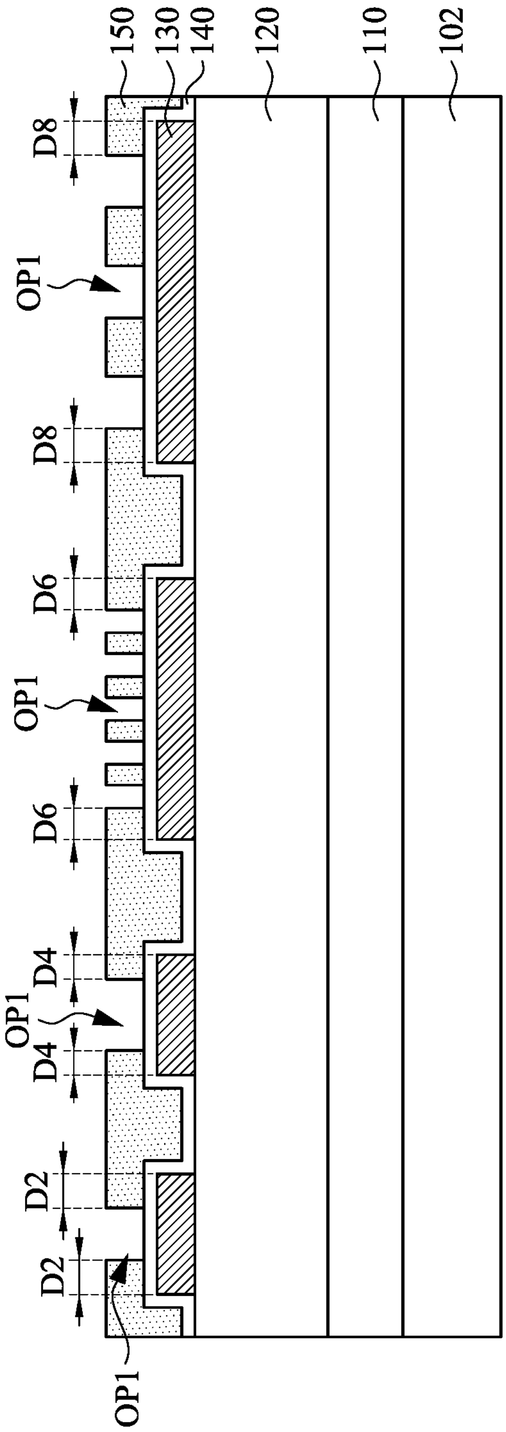

Further, please refer to FIGS. 4-6. FIGS. 4-6 are cross-section views of a method of manufacturing a semiconductor structure in forming a plurality of first openings based on a cross-section AA' of FIG. 1 according to some embodiments of this disclosure. As shown in FIG. 4, a blocking layer 140 is conformally deposited on a top surface of the resist platform layer 130 and a top surface of the stack film layer 120 is not covered by the resist platform layer 130. In some embodiments, the blocking layer 140 is deposited by an atomic layer deposition (ALD) process. In some embodiments, a material of the blocking layer 140 includes an oxide and SiN.

Next, a photoresist layer 150 is formed on the blocking layer 140. Moreover, a top surface of the photoresist layer 150 is higher than a topmost surface of the blocking layer 140. In some embodiments, the photoresist layer 150 is an ArF resist layer. In some embodiments, the photoresist layer 150 is formed by a spin-coating process.

As shown in FIG. 5, a reticle layer 160 containing a plurality of openings 162 based on the hole pattern (such as in FIG. 1) by a lithography process is formed over the photoresist layer 150. The reticle layer 160 exposes a plurality of exposed top surfaces of the photoresist layer 150 based on the hole pattern. That is, the openings 162 in the reticle layer 160 are corresponding to the first hole pattern HP1, the second hole pattern HP2, the third hole pattern HP3 and the fourth hole pattern HP4 (such as in FIG. 1). In some embodiments, the opening 162 of the first hole pattern HP1 (such as in FIG. 1) has a first maximum outer diameter OD1, each of the openings 162 of the second hole pattern HP2 (such as in FIG. 1) has a second maximum outer diameter OD2, each of the openings 162 of the third hole pattern (such as in FIG. 1) has a third maximum outer diameter OD3, and each of the openings 162 of the fourth hole pattern HP4 (such as in FIG. 1) has a fourth maximum outer diameter OD4. In some embodiments, the first maximum outer diameter OD1 is equivalent to or different from the second maximum outer diameter OD2, the third maximum outer diameter OD3 and the fourth maximum outer diameter OD4. In some embodiments, the second maximum outer diameter OD2 is equivalent to or different from the third maximum outer diameter OD3 and the fourth maximum outer diameter OD4. In some embodiment, the third maximum outer diameter OD3 is equivalent to or different from the fourth maximum outer diameter OD4. In other words, the first maximum outer diameter OD1, the second maximum outer diameter OD2, the third maximum outer diameter OD3 and the fourth maximum outer diameter OD4 may be the same or different from each other.

Subsequently, as shown in FIG. 6, the photoresist layer 150 is etched at positions of the plurality of openings 162 (such as in FIG. 5) of the photoresist layer 150 until exposing the plurality of top surfaces of the blocking layer 140 to form a plurality of first openings OP1. Then, the reticle layer 160 (such as in FIG. 5) is removed after etching. In some embodiments, the photoresist layer 150 is etched by a dry etching process. In addition, since a first etching selectivity of the photoresist layer 150 is greater than a second etching selectivity of the blocking layer 140, the photoresist layer 150 are etched until exposing the plurality of top surfaces of the blocking layer 140 to form the first openings OP1 in the photoresist layer 150. In other words, through an etching selectivity ratio between the photoresist layer 150 and the blocking layer 140, the etching process stops at the top surfaces of the blocking layer 140 without continuing etching downward. The boundary rule as mentioned above, each of the first openings OP1 is complied with the boundary rule after etching the photoresist layer 150. That is, a distance from an edge of each of the first openings OP1 based on the first hole pattern HP1 (such as in FIG. 1) to the edge of the resist platform layer 130 is the second boundary distance D2, a distance from an edge of each of the first openings OP1 based on the second hole pattern HP2 (such as in FIG. 1) to the edge of the resist platform layer 130 is the fourth boundary distance D4, a distance from an edge of each of the first openings OP1 based on the third hole pattern HP3 (such as in FIG. 1) to the edge of the resist platform layer 130 is the sixth boundary distance D6, and a distance from an edge of each of the first openings OP1 based on the fourth hole pattern HP4 (such as in FIG. 1) to the edge of the resist platform layer 130 is the eighth boundary distance D8.

It is worth to mention that in the embodiments of forming the photoresist layer 150 by the spin-coating process, the photoresist layer 150 over the resist platform layer 130 may be uniform and thin. Moreover, a second thickness T2 measured from a top surface of the photoresist layer 150 to a top surface of the blocking layer 140 on the stack film layer 120 is greater than a first thickness T1 measured from the top surface of the photoresist layer 150 to the top surface of the blocking layer 140 on the resist platform layer 130. In this way, on one hand, since the first thickness T1 of photoresist layer 150 is thin (such as thinner than the second thickness T2 of the photoresist layer 150), the high resolution of at top surfaces of the photoresist layer 150 corresponding to the openings 162 exposed by an exposure light in the lithography process can be obtained. On the other hand, since the second thickness T2 of the photoresist layer 150 is thick (such as thicker than the first thickness T1 of the photoresist layer 150), the photoresist layer 150 over the stack film layer 120 instead of being disposed over the resist platform layer 130 may resist to the etching process without being etched.

Figure 7:
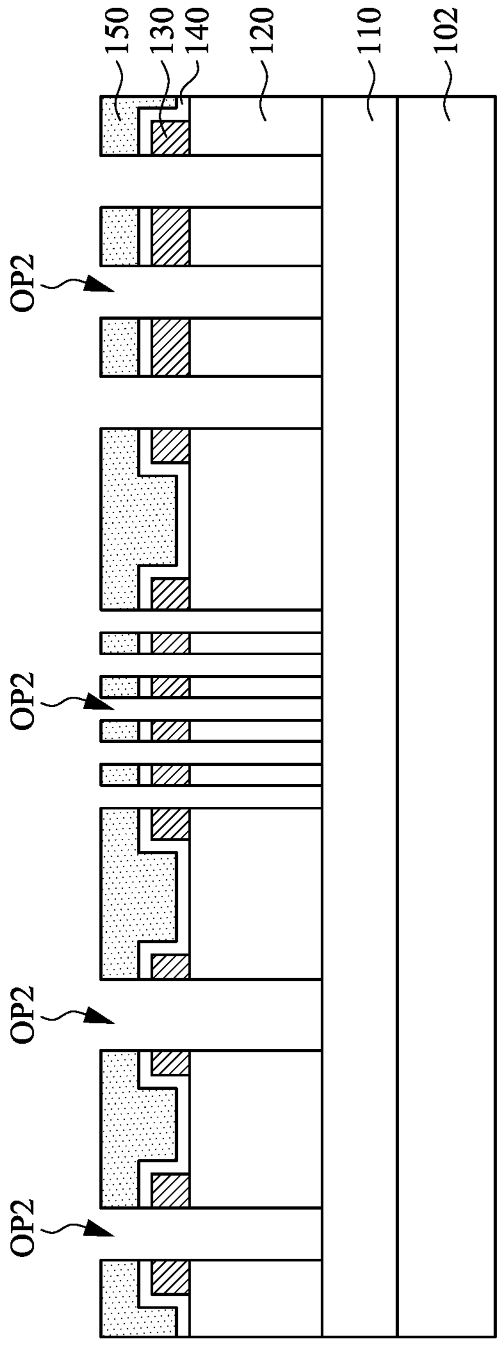
FIGS. 7 and 8 are cross-section views of a method of manufacturing a semiconductor structure in forming a plurality of interconnect structures based on a cross-section AA' of FIG. 1 according to some embodiments of this disclosure.
Figure 8:
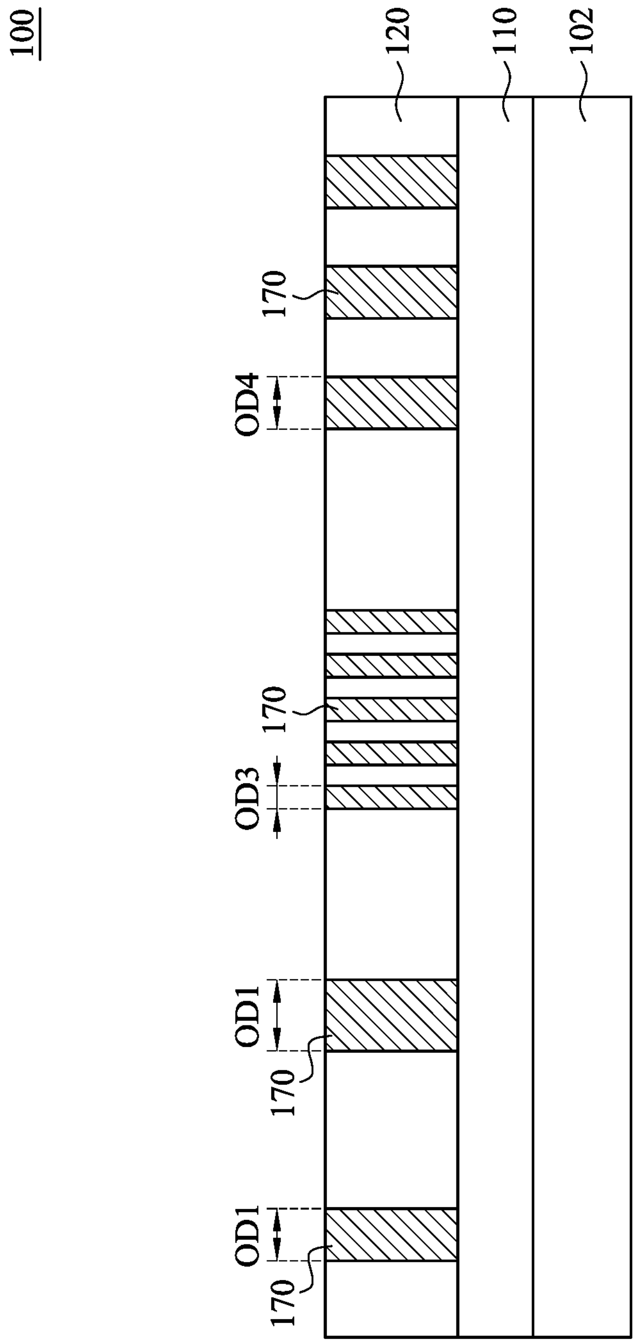

Please refer to FIGS. 7 and 8. FIGS. 7 and 8 are cross-section views of a method of manufacturing a semiconductor structure in forming a plurality of interconnect structures based on a cross-section AA' of FIG. 1 according to some embodiments of this disclosure. As shown in FIG. 7, a plurality of second openings OP2 are formed by etching the blocking layer 140, the resist platform layer 130 and the stack film layer 120 based on the plurality of first openings OP1 (such as in FIG. 6) until exposing a plurality of top surfaces of the active device layer 110. It is worth to mention that in some embodiments, the blocking layer 140 after forming the first openings OP1 (such as in FIG. 6) is served as a negative photoresist layer when forming the second openings OP2. Specifically, the lithography process (such as containing exposure and development) is performed after forming the first openings OP1 (such as in FIG. 6) in the photoresist layer 150. Subsequently, the blocking layer 140, the resist platform layer 130 and the stack film layer 120 covered by the remained photoresist layer 150 are leaved and not etched after etching. In some embodiments, the second openings are formed by a dry etching process. In addition, the second etching selectivity of the blocking layer 140 is greater than a third etching selectivity of the resist platform layer 130, and the third etching selectivity of the resist platform layer 130 is greater than the stack film layer 120.

Subsequently, as shown in FIG. 8, the remained photoresist layer 150, the remained blocking layer 140 and the remained resist platform layer 130 (such as in FIG. 7) are moved by a stripping process. In some embodiments, the stripping process is performed by diluted HF (dHF) or $HNO_3$. Then, a conductive material is filled in each of the second openings OP2 (such as in FIG. 7) to form a plurality of interconnect structures 170, and the semiconductor 100 is formed. Specifically, each of the second openings OP2 (such as in FIG. 7) is filled with the conductive material completely. Next, the excessive conductive material out of each of the second openings OP2 (such as in FIG. 7) is planarized to form a conductive layer 170, also referred to as each of the interconnect structures 170. Moreover, after planarizing the excessive conductive material out of each of the second openings OP2 (such as in FIG. 7), a top surface of the conductive layer 170 and each of the top surfaces of the stack film layer 120 are coplanar. A bottom surface of the conductive layer 170 contacts each of top surfaces of the active device layer 110. In some embodiments, the conductive material includes Cu, W and other suitable conductive materials. In some embodiments, a maximum outer diameter of the conductive layer is from 30 nm to 150 nm. As mentioned above, in this exemplary embodiment of FIG. 8, the first maximum outer diameter OD1 of the conductive layer 170 based on the first hole pattern HP1 (such as in FIG. 1) is from 30 nm to 150 nm, the second maximum outer diameter OD2 of the conductive layer 170 based on the second hole pattern HP2 (such as in FIG. 1) is from 30 nm to 150 nm, the third maximum outer diameter OD3 of the conductive layer 170 based on the third hole pattern HP3 (such as in FIG. 1) is from 30 to 150 nm, and the fourth maximum outer diameter OD4 of the conductive layer 170 based on the fourth hole pattern HP4 (such as in FIG. 1) is from 30 nm to 150 nm. Through disposing the photoresist layer 150, the blocking layer 140 and the resist platform layer 130, a combined height of the photoresist layer 150, the blocking layer 140 and the resist platform layer 130 provides enough etching height for the second openings OP2.

As stated as above, the embodiments of this disclosure provide the method of manufacturing the semiconductor structure through using the resist platform layer on the stack film layer, the blocking layer on the resist platform layer and the photoresist layer on the blocking layer. In this way, via adjusting the different thickness of the photoresist layer through disposing the resist platform layer, the photoresist layer over the resist platform layer is thinner, so that the CD resolution of each of the first openings may be improved. Further, the photoresist layer over the stack film layer instead of the resist platform layer is thicker, so that the etching resistance of the photoresist layer at positions not formed openings may be improved. The combined height of the photoresist layer, the blocking layer and the resist platform layer provides enough etching height for the second openings, which may improve the CD resolution of each of the second openings and a yield of a profile of each of the second openings. Moreover, through the embodiments of this disclosure provide the method of manufacturing the semiconductor structure, a process window among the different hole patterns may be extended.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor structure, comprising:

providing a substrate and an active device layer on the substrate;

forming a stack film layer on the active device layer;

forming a resist platform layer on the stack film layer;

depositing a blocking layer on the resist platform layer conformally;

forming a photoresist layer on the blocking layer, wherein a top surface of the photoresist layer is higher than a topmost surface of the blocking layer, and wherein a second thickness measured from a top surface of the photoresist layer to a top surface of the blocking layer on the stack film layer is greater than a first thickness measured from the top surface of the photoresist layer to the top surface of the blocking layer on the resist platform layer;

etching the resist platform layer until exposing a plurality of top surfaces of the blocking layer to form a plurality of first openings; and etching the blocking layer, the resist platform layer and the stack film layer based on the plurality of first openings until exposing a plurality of top surfaces of the active device layer to form a plurality of second openings.

2. The method of claim 1, wherein etching the plurality of first openings comprising:

forming a reticle layer containing a hole pattern by a lithography process on the photoresist layer, wherein the reticle layer exposes a plurality of exposed top surfaces of the photoresist layer;

etching the photoresist layer at positions of the plurality of exposed top surfaces of the photoresist layer until exposing the plurality of top surfaces of the blocking layer; and removing the reticle layer.

3. The method of claim 2, wherein the hole pattern is corresponding to an area of the plurality of first openings.

4. The method of claim 3, wherein the hole pattern is determined by a boundary rule.

5. The method of claim 4, wherein the boundary rule is that a shortest distance from an edge of each of the plurality of first openings to a closest edge of the resist platform layer is from 0.1 micrometers to 5 micrometers in a top view.

6. The method of claim 1, wherein after etching the blocking layer, the resist platform layer and the stack film layer to form the plurality of second openings, a conductive material is filled in the plurality of second openings to form a plurality of interconnect structures in the stack film layer.

7. The method of claim 1, wherein the resist platform layer is a KrF photoresist layer.

8. The method of claim 1, wherein the photoresist layer is an ArF photoresist layer.

9. The method of claim 1, wherein since an etching selectivity of the photoresist layer is greater than an etching selectivity of the blocking layer, the plurality of first openings are etched until exposing the plurality of top surfaces of the blocking layer.

10. The method of claim 9, wherein since an etching selectivity of the blocking layer is greater than an etching selectivity of the resist platform layer and the etching selectivity of the resist platform layer is greater than an etching selectivity of the stack film layer, the plurality of second openings are formed after etching through the blocking layer.

11. A method of manufacturing a semiconductor structure, comprising:

providing a substrate with an active device layer on the substrate;

forming a stack film layer on the active device layer;

forming a resist platform layer on the stack film layer based on a hole pattern;

depositing a blocking layer on the resist platform layer conformally;

forming a photoresist layer on the blocking layer, wherein a top surface of the photoresist layer is higher than a topmost surface of the blocking layer, and wherein a second thickness measured from a top surface of the photoresist layer to a top surface of the blocking layer on the stack film layer is greater than a first thickness measured from the top surface of the photoresist layer to the top surface of the blocking layer on the resist platform layer;

etching the photoresist layer until exposing a plurality of exposed top surfaces of the blocking layer based on the hole pattern to form a plurality of first openings, wherein the hole pattern is corresponding to an area of the plurality of first openings; and etching the blocking layer, the resist platform layer and the stack film layer until exposing a plurality of top surfaces of the active device layer based on the plurality of first openings to form a plurality of second openings.

12. The method of claim 11, wherein a shortest distance from an edge of each of the plurality of first openings to a closest edge of the resist platform layer is 0.1 micrometers to 5 micrometers in a top view.

13. The method of claim 11, wherein the hole pattern comprises an single-hole pattern, a multiple-hole pattern or a combination thereof.

14. The method of claim 11, wherein a thickness of the resist platform layer is from 100 to 200 nanometers.

15. The method of claim 11, wherein after etching the photoresist layer to form the plurality of first openings, the photoresist layer is served as a negative photoresist layer when etching the blocking layer, the resist platform layer and the stack film layer to form the plurality of second openings.

16. The method of claim 11, wherein a first etching selectivity of the photoresist layer is greater than a second etching selectivity of the blocking layer.

17. The method of claim 16, wherein the second etching selectivity of the blocking layer is greater than a third etching selectivity of the resist platform layer, and the third etching selectivity of the resist platform layer is greater than a fourth selectivity of the stack film layer.

18. The method of claim 11, further comprising:

filling a conductive material in each of the plurality of second openings; and planarizing the excessive conductive material out of each of the plurality of second openings to form a conductive layer, wherein after planarizing the excessive conductive material out of each of the plurality of second openings, a top surface of the conductive layer and each of the plurality of top surfaces of the stack film layer are coplanar.

19. The method of claim 18, wherein a bottom surface of the conductive layer contacts each of the plurality of top surfaces of the active device layer.

* * * * *